United States Patent [19]

Nishimura et al.

[11] Patent Number: 5,523,588
[45] Date of Patent: Jun. 4, 1996

[54] DIAMOND FILM FIELD EFFECT TRANSISTOR WITH SELF ALIGNED SOURCE AND DRAIN REGIONS

[75] Inventors: Kozo Nishimura; Hisahi Koyama; Koji Kobashi, all of Kobe, Japan

[73] Assignee: Kabushiki Kaisha Kobe Seiko Sho, Kobe, Japan

[21] Appl. No.: 269,896

[22] Filed: Jul. 6, 1994

[30] Foreign Application Priority Data

Sep. 28, 1993 [JP] Japan .................................. 5-241709

[51] Int. Cl.⁶ ...................... H01L 31/0312; H01L 29/80; H01L 29/12
[52] U.S. Cl. ................. 257/77; 257/280; 257/613
[58] Field of Search ............................ 257/77, 280, 613; 437/100

[56] References Cited

U.S. PATENT DOCUMENTS 5,107,315  4/1992  Kumagai et al. ..................... 257/77
5,114,871  5/1992  Jones .................................... 257/77
5,298,765  3/1994  Nishimura ........................... 257/280

*Primary Examiner*—Steven H. Loke
*Attorney, Agent, or Firm*—Oblon, Spivak, McClelland, Maier & Neustadt

[57] ABSTRACT

A diamond film field effect transistor, excellent in characteristics and a method of manufacturing the transistor, in which a contact resistance between electrodes and respective source and drain region is small. The transistor has a channel layer of a p-layer made of semiconducting diamond, an i-layer made of high resistance diamond as a gate insulating layer, which is formed on the channel layer, a gate electrode film formed on the i-layer and a source region and a drain region formed on the surface of the i-layer in self-alignment to the gate electrode film by ion implantation using the gate electrode film, side walls and a protective film as masks.

15 Claims, 8 Drawing Sheets

FIG. I
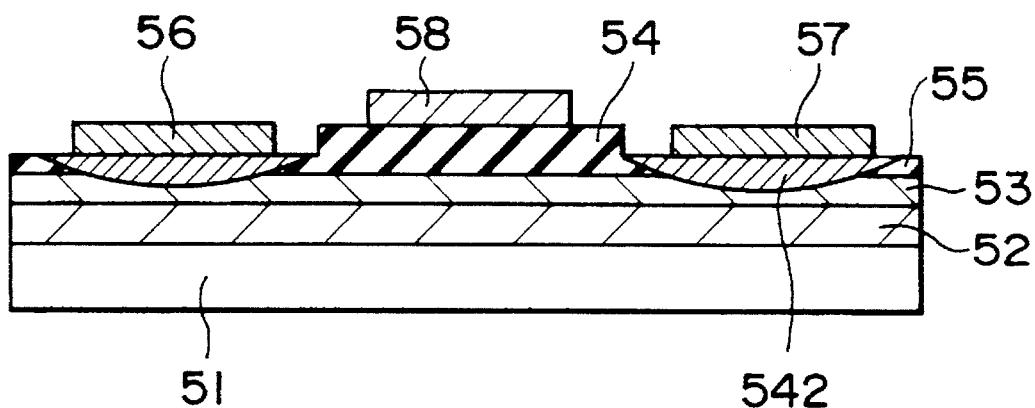
FIG. 2
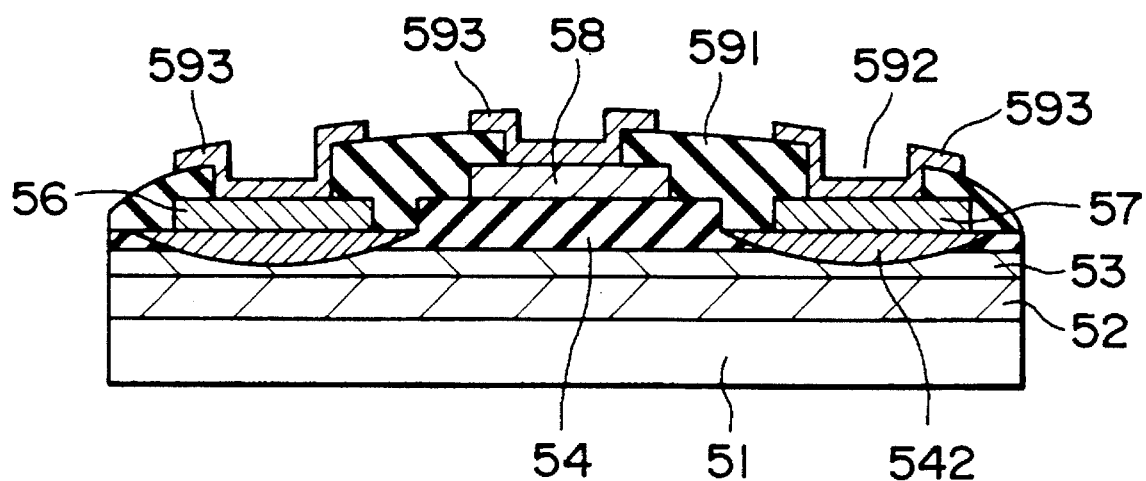

DIAMOND FILM FIELD EFFECT TRANSISTOR WITH SELF ALIGNED SOURCE AND DRAIN REGIONS

BACKGROUND OF THE INVENTION

1. Field of the Invention

The present invention relates to a diamond film field effect transistor having a channel layer made of semiconducting diamond, and a method of manufacturing the transistor.

2. Description of the Related Art

Diamond is a well known electrical insulating material. It is excellent in heat-resistance. It can exhibit p-type semiconducting property when doped with boron (B). Vapor phase synthesis has been recently established as a method of forming diamond films. Using semiconducting diamond films attempts have been made to manufacture electronic devices, such as diodes and transistors, which are excellent in heat-resistance.

FIG. 8 is a sectional view of a prior art metal-insulator-semiconductor field effect transistor (hereinafter, referred to as "MISFET") using monocrystalline diamond films (Unexamined Japanese Patent Publication No. HEI 1-158774). In this transistor, a B-doped monocrystalline p-type semiconducting diamond film 12 (hereinafter, referred to as "p-layer") is formed by vapor-phase synthesis on a monocrystalline diamond substrate 11. An undoped (or high resistance) diamond film 13 (hereinafter, referred to as "i-layer") is then laminated on the p-layer 12. The i-layer 13 is subjected to patterning in a specified shape. After that, a source electrode 14 and a drain electrode 16 are formed on the p-layer 12, and a gate electrode 15 is formed on the i-layer 13. The film thickness of the p-layer 12 is about 0.5 µm.

In a prior art manufacturing method shown in FIGS. 9A to 9E, a source electrode and a drain electrode selectively grow in self-alignment to a gate electrode (Unexamined Japanese Patent Publication No. HEI 5-29609). A p-layer 22 is coated on a substrate 21 (FIG. 9A); a mask 27 is formed on the p-layer 22 in a shape on which a source electrode and a drain electrode are to be formed (FIG. 9B); and an i-layer 23 is formed on the p-layer 22 exposed from the mask 27 so as to slightly extend on the mask 27 (FIG. 9C). The mask 27 is then removed (FIG. 9D), and a source electrode 24, a drain electrode 25 and a gate electrode 26, which are all made of the same material, are deposited (FIG. 9E).

In another prior art manufacturing method shown in FIGS. 10A to 10E (Unexamined Japanese Patent Publication No. HEI 5-29608), a p-layer 32 is deposited on a substrate 31. A metal film 34 and a lift-off film 36 are (FIG. 10A) formed on the p-layer 32. The metal film 34 and the lift-off film 36 are then etched (FIG. 10B), and an i-layer 33 as a gate insulating layer is formed on the p-layer 32 (FIG. 10C). A gate electrode 35 is coated (FIG. 10D) over the whole surface, and the lift-off film 36 is removed (FIG. 10E), thus forming an MISFET structure.

The above-described prior art techniques, however, have the following disadvantages. First, in the prior art technique shown in FIGS. 9A to 9E, the i-layer 23 is required to grow in the shape shown in FIG. 9D. However, the umbrella-like projection of diamond shown in FIG. 9D is difficult to be formed because the density of generating nuclei of diamond on the mask 27 is small in practice. The reference disclosing this prior art technique also shows a modification which are illustrated in FIG. 11. In this modification, masks 43 and 44 are stepwise formed on a p-layer 43 provided on a substrate 41 for forming an umbrella-like projection of an i-layer 45. However, even in this method, the it 45 is difficult to grow i-layer 45 stepwise on the masks 43 and 44. As a result, it is difficult to actually form the shape structure shown in FIG. 11. To manufacture MISFITS with a high repeatability, the length of the umbrella-like projection must be accurately controlled. However, such a control cannot be obtained by this method. It is difficult to fabricate a fine device which has source to drain electrode distance of a few microns using the selective growth process disclosed in this prior art.

The contact resistance between the p-layer 22 and the electrodes (24 and 25) is the critical disadvantage of this prior art technique. To lower the contact resistance, the device must be thermally treated; however, it cannot be lowered to be less than about $10^{-4}$ $\Omega cm^2$ only by heat-treatment. To lower the contact resistance to a practical value of $10^{-5}$ $\Omega cm^2$ or less, it is essential to form a diamond layer of low resistivity doped with B at a high concentration (hereinafter, referred to as "$p^+$ layer") between the source and drain electrodes 24, 25 and the p-layer 22 by ion implantation or in situ doping. However, this is impossible using the prior art technique.

In this prior art technique, the gate electrode 26 is made of a metal, such as Ti, so it is easy to form carbides. Accordingly, the characteristics of the gate electrode are deteriorated by thermal treatment at high temperatures (for example, 600° C. or more).

On the other hand, in the prior art shown in FIGS. 10A to 10E, the films 34 and 36 must be etched by plasma until the p-layer 32 is exposed from the surface in the process shown in FIG. 10B. At this time, the surface of the p-layer 32 is damaged by the plasma-etching, which causes a problem in deteriorating the characteristics of the p-layer 32. The high contact resistance is the problem which can not be circumvented in this prior art.

SUMMARY OF THE INVENTION

An object of the present invention is to provide a diamond film field effect transistor having excellent characteristics. The contact resistance between electrodes and a source-drain region can be reduced; and a method of manufacturing the transistor.

To achieve the above object, according to a first aspect of the present invention, is provided a diamond film field effect transistor comprising: a channel layer on a substrate; a gate insulating layer made of high resistance diamond which is formed on the channel layer; a gate electrode formed on the gate insulating layer; and a source region and a drain region formed on the surface in self-alignment to the gate electrode by ion implantation using the gate electrode as a mask.

In a second aspect of the present invention, there is provided a method of manufacturing a diamond film field effect transistor comprising the steps of:

forming a semiconducting diamond film on a substrate;

laminating a high resistance diamond layer or non-diamond insulating layer as a gate insulating layer on the semiconducting diamond film;

depositing a gate electrode material film on the gate insulating layer;

forming a gate electrode pattern on the gate electrode material by plasma etching, ion milling, reactive ion etching or wet etching;

forming side walls on the side surfaces of the gate electrode (as needed);

etching the gate insulating layer made of the high resistance diamond layer or non-diamond insulating layer using the gate electrode material film and the side walls for removing the gate insulating layer or reducing the thickness of the gate insulating layer;

performing thermal treatment for the surface after ion implantation on the surface and forming a source electrode and a drain electrode so as to be in contact with all or at least part of the ion implanted region.

In this method, preferably, a passivation film is formed over the whole surface and contact holes for extraction electrodes are formed on the passivation film, to be connected to an external wiring.

BRIEF DESCRIPTION OF THE DRAWINGS

FIG. 1 is a sectional view showing a diamond film field effect transistor according to a first embodiment of the present invention;

FIG. 2 is a sectional view showing a diamond film field effect transistor according to a second embodiment of the present invention;

DETAILED DESCRIPTION OF THE PREFERRED EMBODIMENTS

Hereinafter, embodiments of the present invention will be described in detail with reference to the accompanying drawings.

FIG. 1 is a sectional view showing a diamond film field effect transistor according to a first embodiment of the present invention. FIGS. 5A to 5D, and FIGS. 6A to 6D are sectional views showing processes in a method of manufacturing the above transistor of the first embodiment.

(1) Formation of Diamond layer and Electrode Material Layer

Figure 5A:
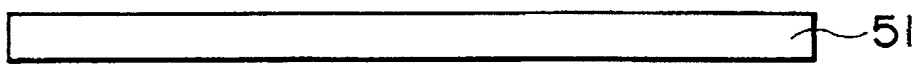
FIGS. 5A to 5D are sectional views showing the processes in a method of manufacturing the diamond film field effect transistors as shown in FIGS. 1 and 2.

In FIG. 5A, reference numeral 51 designates a substrate. The substrate 51 may be made of Si, ceramics such as silicon oxide, silicon nitride and boron nitride or metals such as W, Mo, Ta, Ni and Cu. Artificial or natural monocrystalline diamond and the above materials on which diamond is formed are produced by vapor-phase synthesis.

Figure 5B:
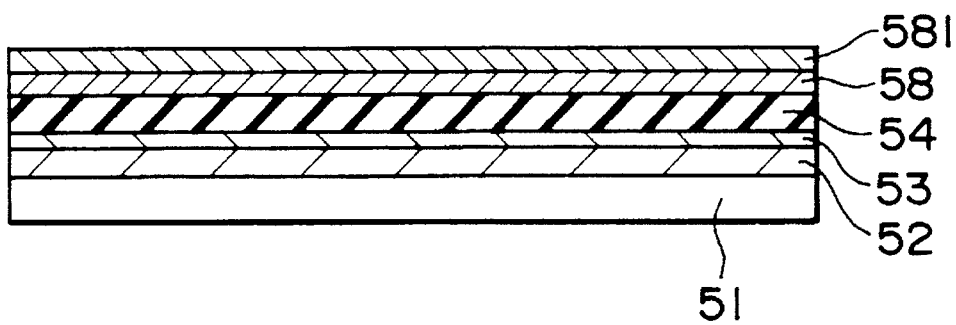

As shown in FIG. 5B, an i-layer 52 made of undoped or high resistance diamond is grown on the substrate 51, and a p-layer (p-type semiconducting diamond layer doped with B) 53 is laminated on the i-layer 52. In general, a diamond film formed by vapor-phase synthesis at the position is in close proximity to a non-diamond substrate that has a lot of defects and is poor in crystallinity. For this reason, the p-layer directly formed on the non-diamond substrate is poor in terms of electrical characteristics. On the contrary, the p-layer 53, which is laminated on the i-layer 52 formed on the substrate 51 as shown in FIG. 5B, is excellent in crystallinity and electrical characteristics. An i-layer 54, as a gate insulating layer, is then laminated on the p-layer 53. The film thickness of the i-layer 54 is preferably in the range from 0.001 to 1 µm. The i-layer 54, as the gate insulating layer, may be replaced by a high resistance layer made of a non-diamond material such as silicon oxide.

A film 58, as a gate electrode material, is laminated on the i-layer 54. In addition, the sample must be thermally heated after ion implantation as described later. For this reason, the gate electrode material is required to be conductive, and to be excellent in heat-resistance so it does not melt or deteriorate at a high temperature of about 800° C., and not to react with diamond. The gate electrode material may include high melting point metals such as Au, Pt, W, Mo, Ta and Hf; C, Si, BN and diamond which are doped with impurities at a high concentration; carbides of W, Mo, Ta, Hf, Ti, V, Nb, Mn, Fe, Co, Ni, B and Si; and a nitride of Ti and Nb.

Carbides of transition metals, such as TiC, are most suitable for the gate electrode material. Carbide already contains carbon. Accordingly, when the sample is thermally treated after ion implantation, carbon in diamond is difficult to be diffused in the electrode material made of carbide. Other than TiC, which is described above, carbides of W, Mo, Ta, Hf, Ti, V, Nb, Mn, Fe, Co, Ni, B and Si are preferably used. As for carbides of B, B6.5Cx is a conductive material, and may be used as the gate electrode material.

Noble metals such as Au and Pt never form carbides and thereby eliminate the fear of deteriorating a gate electrode film 58, and are also suitable as the gate electrode materials. Nitrides of Ti and Nb have a small diffusion coefficient of carbon, and are suitable as gate electrode materials.

In fact, the carbides, noble metals and nitrides described above are not deteriorated in their electric characteristics by thermal treatment performed for 1 hr in a vacuum ($2 \times 10^{-6}$ Torr or less) at 800° C. They do not deteriorate by thermal treatment in an inert gas such as Ar nor in hydrogen gas.

The gate electrode may be formed of a single layer film or a multi-layer film made from one or more kinds of the selected. Furthermore, a film can be made from a mixture of these materials. The electrode film may be formed by sputtering, electron beam deposition, vacuum deposition or chemical vapor deposition (CVD).

To prevent the ion-implantation for the gate electrode film 58, using the subsequent process, a protective film 581, as a barrier for ion implantation, is laminated on the gate electrode material film 58. The protective film 581 may be made of metals such as Au or other ceramics.

The gate electrode film 58 and the protective film 581 act as masks for preventing ion implantation for the i-layer 54. In this regard, the film thicknesses of the 58 and 581 films, must be determined accordingly to the energy of ion implantation. The film thickness of the protective film 581 is either within the preferable range of 1 µm or more.

(2) Formation of Electrode Pattern

Figure 5C:
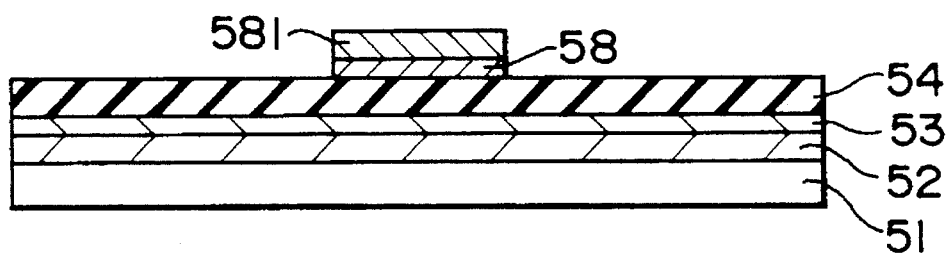

The gate electrode film 58 and the protective film 581 are subjected to patterning in a shape on which a gate electrode is to be formed, as shown in FIG. 5C. The patterning for the gate electrode film and the protective film is done either using an usual photolithography technique (lift-off or plasma etching), electron beam lithography or X-ray lithography.

For example, the plasma etching for TiC is performed using a $CF_4$ gas, a mixed gas of $CF_4$ and $O_2$, or each of these source gases diluted with an inert gas such as Ar. Thus, the gate electrode pattern is thus formed, as shown in FIG. 5C.

(3) Formation of Side Wall

Figure 5D:
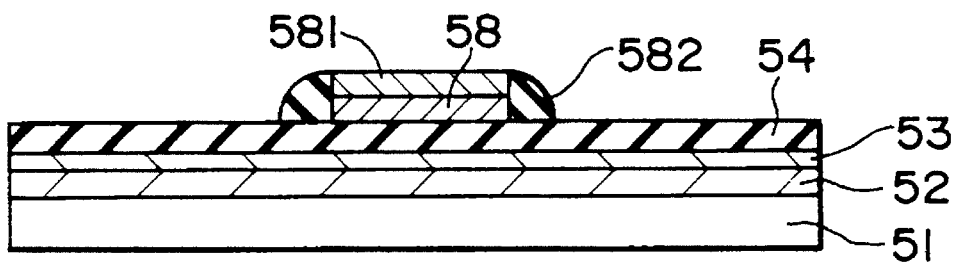

Side walls 582 are formed on the side wall portions of the gate electrode film 58 and the protective film 581, as shown in FIG. 5D.

The side walls 582 are provided to locate $P^+$ regions. The $p^+$ layer 542, which are formed by ion implantation as described later, are provided to locate $p^+$ regions at positions separated from the gate electrode film 58. This prevents the $p^+$ layer 542 from being short-circuited with the gate electrode film 58 or from being excessively close which and generating a high electric field between them. In this regard, the film thickness of the side wall 582 is within the preferable range of 0.01 µm or more. The side wall 582 is formed by a method where a film for the side wall is deposited by plasma CVD or sputtering, and then etched by plasma. The material of the side wall is an insulating material, and may include silicon oxide, silicon nitride, boron nitride and diamond. Silicon nitride is preferable, because it is similar to diamond in terms of the thermal expansion coefficient, and is also less susceptible to stress by thermal treatment performed after ion implantation.

The side walls 582 may be removed in a step after ion implantation. In some cases through, it may be not removed.

(4) Etching

Figure 6A:
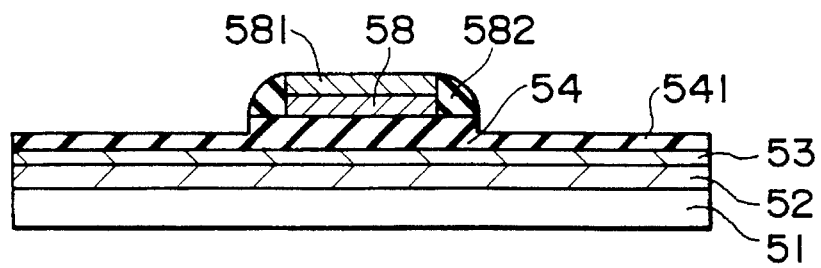
FIGS. 6A to 6D are sectional views showing the continued processes in the method of manufacturing the diamond film field effect transistors as shown in FIGS. 5A to 5D.

As shown in FIG. 6A, the i-layer 54 is etched by plasma using the gate electrode film 58, the protective film 581 and the side walls 582 as masks. These are used to reduce the film thickness of the i-layer 54. When the film thickness of the i-layer 54 is 1.0 µm or more, a high ion energy (larger than 800 KeV) is required to implant ions of B up to the p-layer 53. To perform an ion implantation with such a high energy, the gate electrode film 58, protective film 581 and side wall 582 must be increased in thickness. Unfortunately the result is that they are difficult to be formed in fine structures. However, when the energy required for ion implantation is excessively high, a lot of lattice defects are generated in the p-layer 53, which exerts adverse effect on the device characteristics.

For this reason, prior to ion implantation, the film thickness of the i-layer 54 is reduced to be as thin as possible. When the film thickness of the i-layer 54 is 0.4 µm or less, the ion implantation requires only an energy of 30 KeV, thereby reducing defects generated in the p-layer 53.

A gas for etching the i-layer 54 by plasma may include an $O_2$ gas, a mixed gas of $O_2$ and $H_2$, and a mix of both of these gases with an inert gas such as Ar. Since the etching rate of a diamond film is substantially constant with respect to the etching time, the film thickness of the i-layer 54 can be controlled with an accuracy of ±0.1 µm or more. The film thickness of the i-layer 54 may be measured by an in situ laser interference method to increase the accuracy of the film thickness. The plasma etching may be performed using dc plasma, high frequency plasma, microwave plasma or ECR plasma. The film thickness of the i-layer 54 may be reduced by ion milling or wet etching in place of plasma etching.

(5) Ion Implantation

Figure 6B:
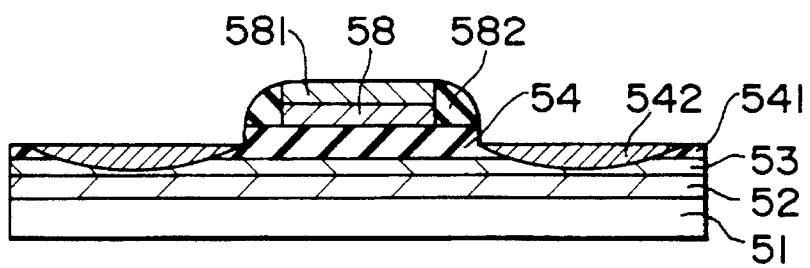

The i-layer 541 which is reduced in its film thickness as shown in FIG. 6B, is subjected to ion implantation using the gate electrode film 58 with the protective film 581 and the side walls 582 as a mask. In the gate electrode region which is shielded by the protective film 581, gate electrode film 58 and the side walls 582, ions do not reach the diamond p-layer 53. On the contrary, on the other region, the surface of diamond is ion-implanted to be reduced in the resistance. As described later, an effective source electrode and drain electrode are formed in a region 542 with the reduced resistance. Thus, only by ion implantation over the whole surface of the semiconductor device, the gap between the source and drain electrodes and the gate electrode is automatically aligned by the self-alignment process. The film thickness of the protective film must be determined on the basis of the energy of ion implantation, the material and the film thickness of the gate electrode. It may be specified to be about in the range of about 0.01 µm or more.

The ion seed to be implanted in the region 542 on the surface of diamond is not limited as it becomes the low resistance p-type semiconducting diamond (p-layer). The most suitable ion seed is boron (B). In the subsequent process shown in FIG. 6C, a source electrode 56 and a drain electrode 57 are formed on the ion-implanted region 542. At this time, the contact resistance of the electrodes, with a resistance region 542, is low.

After ion implantation, the region 542 is required to be thermally treated at 1000° C. to electrically activate the implanted ions. In this thermal treatment, the gate electrode film 58 which is already formed must resist such high temperatures. The above-described gate electrode material has no problem in terms of heat-resistance.

However, as a result of the experiments by present inventors, the ions of B, which are implanted with an acceleration voltage between 60 and 300 KeV, at a dose rate of from $10^{14}$ to $3 \times 10^{16}/cm^2$, can be activated by the thermal treatment at a relatively low temperature of 600° C. for 60 min or more. Moreover, when a Ti electrode is formed on the $P^+$ layer thus formed, the contact resistivity thereof becomes smaller to be $10^{-5}$ $\Omega cm^2$ or less.

(6) Formation of Source Electrode and Drain Electrode

Figure 6C:
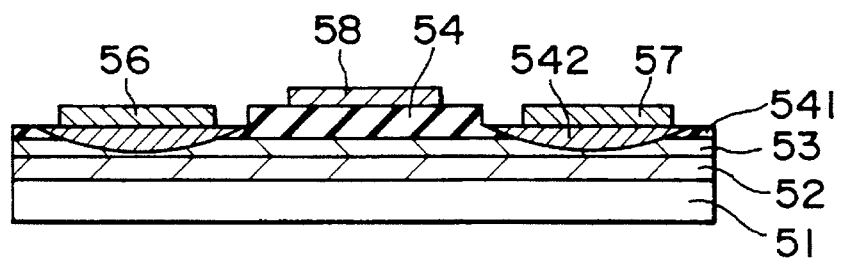

After the side walls 582 and the protective film 581 are removed, as shown in FIG. 6C, the source electrode 56 and the drain electrode 57 are formed. They are formed using a general photolithography technique so that all or at least part of the source and drain electrodes 56 and 57 cover the ion implanted diamond surface region 542. The source electrode 56 and the drain electrode 57 may be made of the same material as the gate electrode film 58.

Alternatively, the $p^+$ layer is first formed by vapor-phase synthesis using the selective growth technique. The electrodes 56 and 57 are formed on the $p^+$ layer. In this case, the contact resistance between the source and drain electrodes, 56 and 57, and the $p^+$ layer can be reduced to $10^{-4}$ $\Omega cm^2$ or less. However, since the p-layer 53 and the $p^+$ layer are made of diamond, it is difficult for them to deteriorate in their characteristics. For example, the interface between is less susceptible to stress, caused by the thermal expansion difference, even at high temperatures. Thus, a diamond field effect transistor shown in FIG. 1 can be completed.

(7) Formation of Protective Film and Contact Hole

Figure 6D:
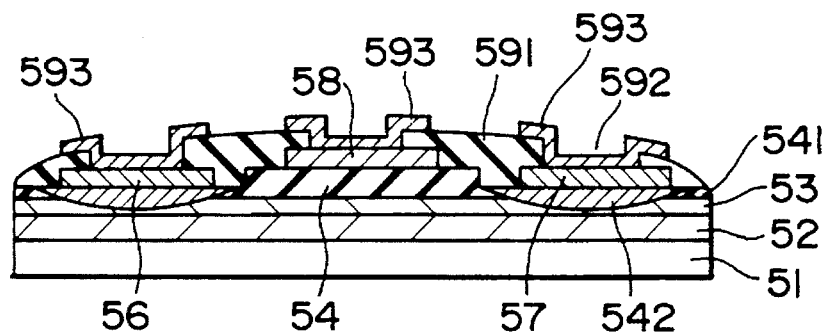

FIG. 6D shows the field effect transistor structure in which a passivation film 591 is deposited after the side walls 582 are removed by etching. Contact holes 592 are opened on the passivation film 591 by plasma etching, to extract electrodes 593 for the gate. Source and drain electrodes 593 connected to electrodes 56 and 57 are formed. Using the passivation film 591 (which is made of a diamond film) the interface between the extraction electrode 593 and the passivation film 591 is less susceptible to stress at a temperature of 400° C. or more, thus manufacturing a field effect transistor which is difficult to deteriorate.

The passivation film 591 may be made of a single layer film or a multi-layer film of insulating materials of a resistivity of at least $10^{10}$ Ωcm such as silicon oxide and silicon nitride, and a film made of a mixture of these materials. Silicon nitride has a thermal expansion coefficient similar to diamond, and is less susceptible to thermal stress. Silicon oxide is stable in the atmospheric air at high temperatures. Part of the passivation film may be made of diamond and the other may be made of non-diamond material. Thus, the diamond film field effect transistor, as shown in FIG. 2, is completed.

In the above-described embodiment, the i-layer 54 made of undoped or high resistance diamond is used as the gate insulating layer. However, the i-layer may be made of non-diamond material such as $SiO_2$. The film thickness of the i-layer 54 is in the preferable range of 0.001 to 1 μm. When the gate insulating layer is made of $SiO_2$, the side walls 582 are not necessarily formed. However, this layer is not necessarily etched when the film thickness is suitable. This is because the insulating property of $SiO_2$ is not lost even by ion implantation of B. However, for the field effect transistor, in which the source-drain electrode distance is substantially the same as the gate length, a high electric field is applied between the gate insulating layer and the gate electrode film 58, so that the side walls 582 may be required. The transistor in this embodiment can be manufactured according to the same method as shown in FIGS. 5A to 5D and FIGS. 6A to 6D.

The gate insulating layer 54 may be not provided. In this case, side walls 582 are required for insulation of the gate electrode film 58 from the p-layer 53. The transistor in this embodiment can be also be manufactured in the same method as shown in FIGS. 5A to 5D and FIGS. 6A to 6D.

In general, a polycrystalline diamond film grows by vapor-phase synthesis on a substrate made of a non-diamond material such as silicon. Polycrystalline diamond has a problem in terms of electric characteristics, such as, small mobility. Accordingly, a monocrystalline diamond film or a diamond film having the electric characteristics comparable to it is preferred for electronic devices.

As in the diamond film constituting the above semiconductor device, there may be a high oriented diamond film which covers the surface with (100) crystal planes of diamond particles and orients the diamond particles to each other. The high oriented diamond film is in the epitaxial relationship to the substrate. That means that, (100) crystal planes of diamond particles are parallel to the substrate and that the crystal orientations of the diamond particles are ordered to the crystal orientation of the substrate.

As compared with a polycrystalline film, a high oriented diamond film has less boundary and crystal defects, and is larger in mobilities of electrons and holes which makes it excellent in the area of electrical characteristics. Using a high oriented diamond film for a field effect transistor, can significantly improve the transistor characteristics such as the drain current amount, transconductance and high frequency.

Artificial or natural monocrystalline diamond has an area of several mm², while the high oriented film is not limited in terms of the area. In this regard, high oriented films are suitable for mass-production and reduction in the cost of electronic devices.

It is well known that the transistor characteristics are improved as the gate length of a field effect transistor is shortened. Since diamond has a high resistance, the diamond film field effect transistor characteristics are significantly enhanced with the gate length of 1 μm or less.

Figure 3:
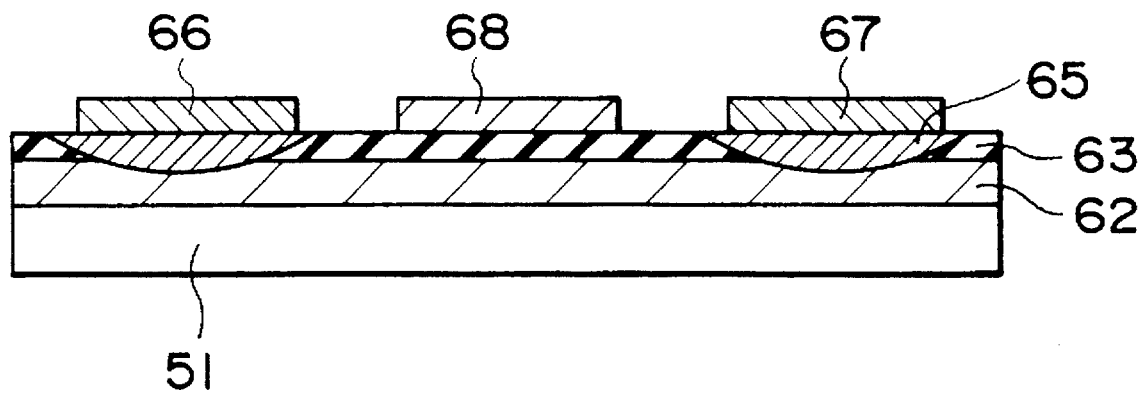
FIG. 3 is a sectional view showing a diamond film field effect transistor according to a third embodiment of the present invention.
Figure 4:
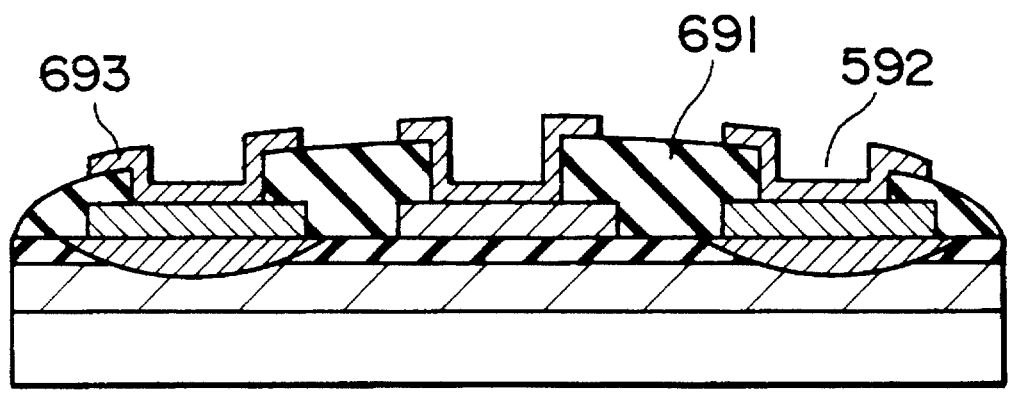
FIG. 4 is a sectional view showing a diamond film field effect transistor according to a fourth embodiment of the present invention.

FIGS. 3 and 4 show the structures of the field effect transistors shown in Examples 3 and 4, respectively. Number 51 is a substrate; 62 is an i-layer; and 63 is a p-layer on which a gate electrode is directly formed. Region 65 is a source or a drain region, electrodes 66 and 67 are the source and drain electrodes, and electrode 68 is the gate electrode. The manufacturing methods are the same as the ones shown in FIGS. 5A to 5D and FIGS. 6A to 6D, except that the process (FIG. 6A) of forming the i-layer 54 under the gate electrode and etching is eliminated. FIG. 4 shows the structure of a transistor where a passivation film is formed on the transistor shown in FIG. 3. Contact holes and external wirings are also formed. The formation of the passivation film and the contact holes are also performed according to the process shown in FIG. 6D.

The present invention is more clearly understood with reference to the following examples.

In these examples, diamond film field effect transistors, according to the embodiments of the present invention, are manufactured and evaluated for their characteristics.

EXAMPLE 1

Diamond high oriented films (i-layer 52, p-layer 53 and i-layer 54) were synthesized on a (100) silicon substrate by microwave plasma CVD. The film thicknesses of these layers were as follows: the i-layer 52 was 20 μm, the p-layer 53 (concentration of doped boron: $10^{17}/cm^3$) was 0.1 μm, and the i-layer 54 was 0.4 μm. A TiC layer 58 was then deposited by magnetron sputtering, and a protective film 581 made of Au was laminated thereon. The film thicknesses of TiC and Au, which were subjected to patterning by plasma etching, were 0.2 μm and 0.4 μm, respectively.

To form side walls 582, a $SiO_2$ film was formed to a thickness of 0.6 μm by high frequency plasma CVD. The $SiO_2$ film was etched about 0.6 μm by high frequency plasma etching using a $CF_4$ gas. This is done to form the side walls 582 each having a thickness of 0.2 μm, on the side surfaces of the electrode.

The i-layer 54 was etched by 0.3 μm by ECR plasma etching using an $O_2$ gas. Ions of B were then implanted in the i-layer 54 with an acceleration voltage of 100 KeV at a dose rate of $3 \times 10^{16}/cm^2$. After that, the i-layer 54 was thermally treated in an Ar atmosphere (gas pressure: 0.1 Torr) at 800° C. for 60 min. Finally, a Ti/Au double layer film as a source electrode 56 and a drain electrode 57 was formed.

The gate length of the field effect transistor that is manufactured was 2 μm. A source-drain electrode distance was 2.4 μm. This is referred to as a device A.

Figure 8:
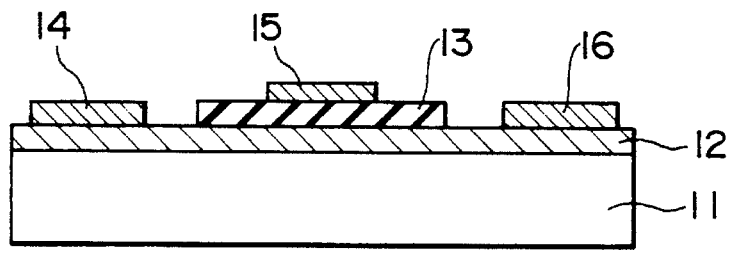
FIG. 8 is a sectional view showing a prior art MISFET.
Figure 9A:
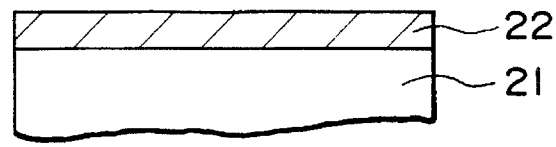
FIGS. 9A to 9E are sectional views showing processes in a method of manufacturing a prior art MISFET.
Figure 9B:
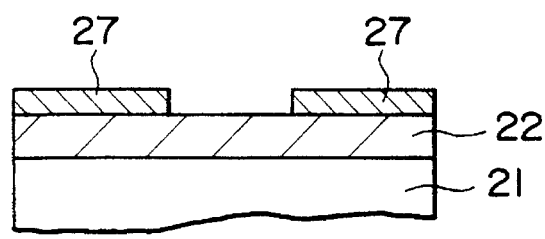
Figure 9C:
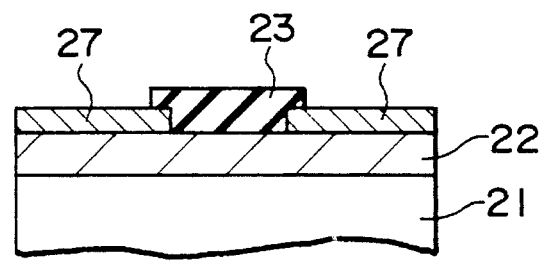
Figure 9D:
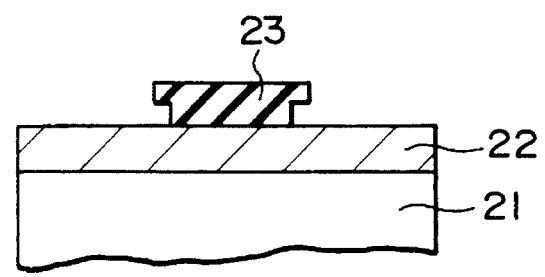
Figure 9E:
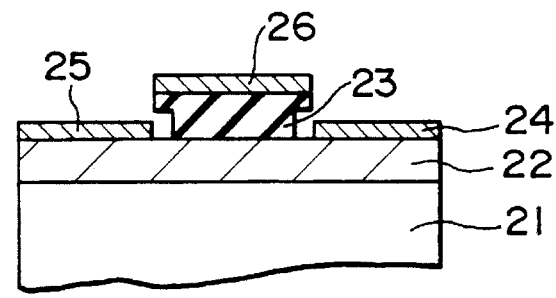
Figure 10A:
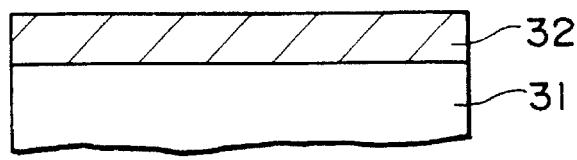
FIGS. 10A to 10E are sectional views showing the processes in another method of manufacturing a prior art MISFET.
Figure 10B:
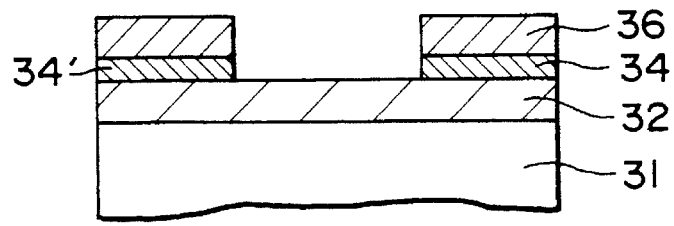
Figure 10C:
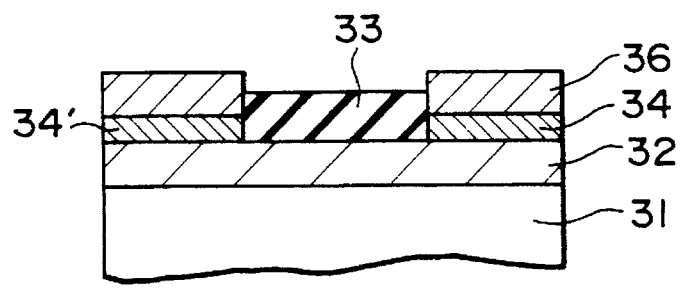
Figure 10D:
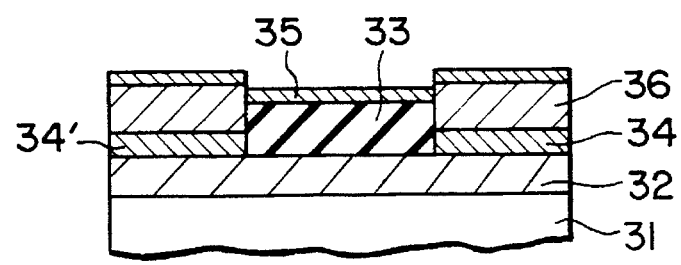
Figure 10E:
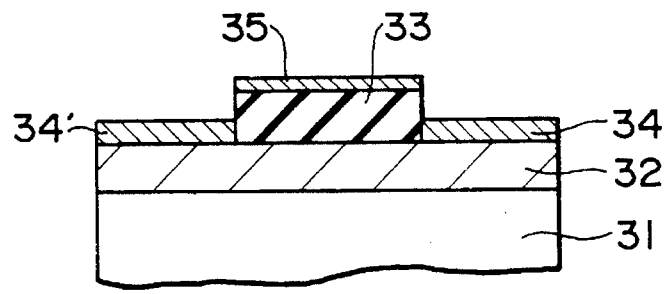
Figure 11:
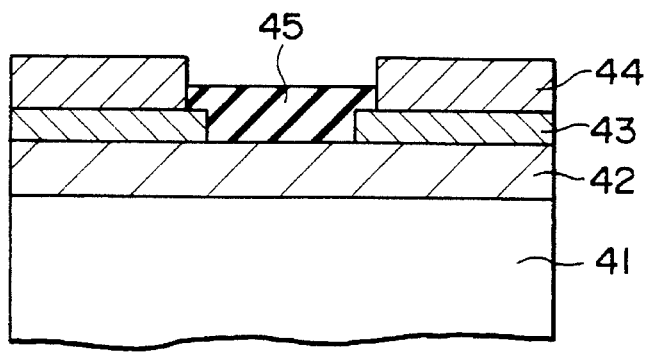
FIG. 11 is a sectional view showing a modification of the method of manufacturing the FET which is shown in FIGS. 9A to 9E.

As a comparative example, a field effect transistor was manufactured according to the prior art shown in FIG. 8. This is referred to as a device B. In this device B, the gate length was 2 μm, and a source-drain electrode distance was 10 μm.

Figure 7:
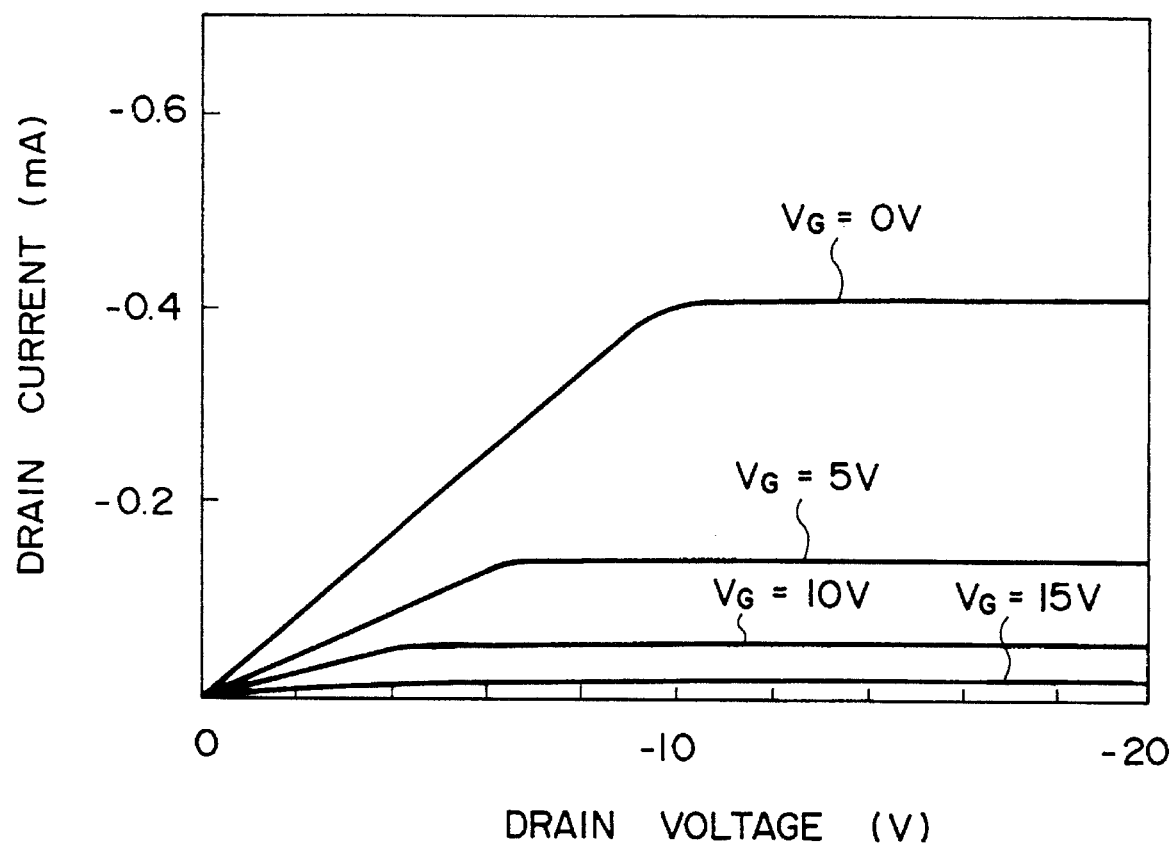
FIG. 7 is a graph showing a current-voltage characteristic of the diamond film field effect transistor according to the embodiment of the present invention.
Figure 12:
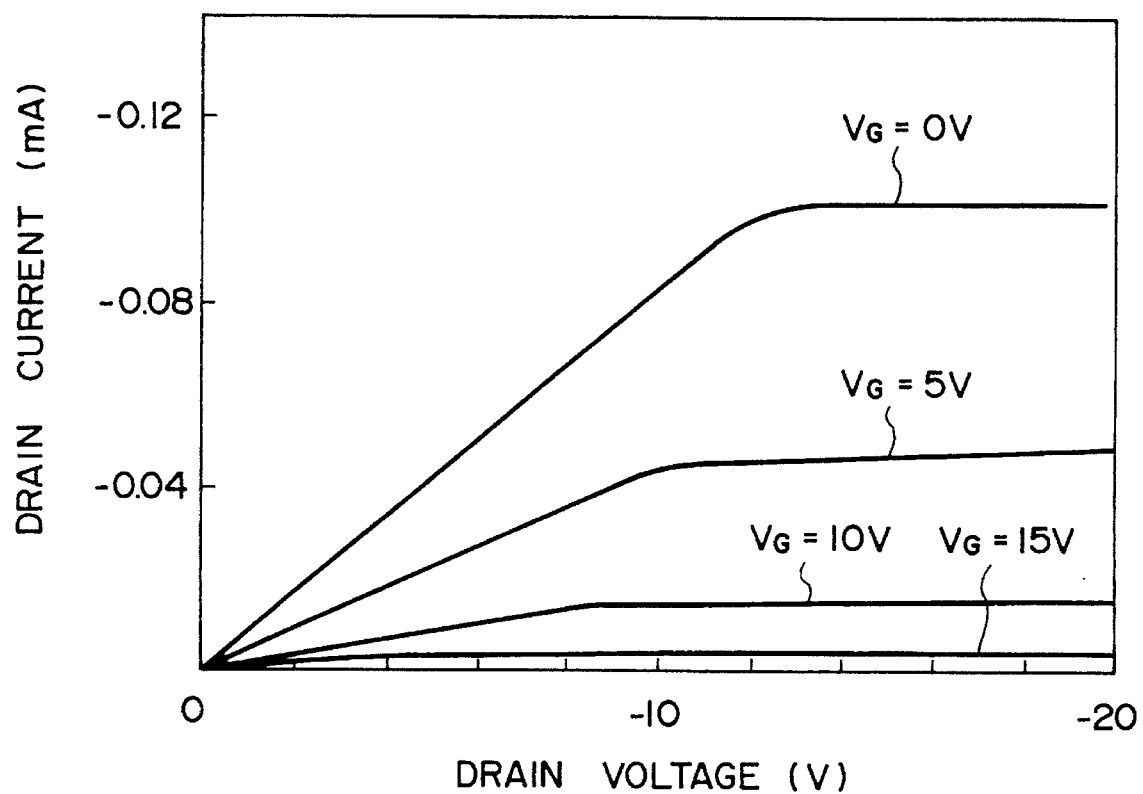
FIG. 12 is a graph showing a current-voltage characteristic of the MISFET (comparative example) manufactured by the prior art.

FIG. 7 shows the characteristics of the device A; and FIG. 12 shows the characteristics of the device B. In the device A, for the drain voltage of −20 V and the gate voltage of 0

V, the drain current was 0.4 mA and the transconductance was 0.4 mS/mm. In the device B, under the same bias condition, the drain current was 0.1 mA and the transconductance was 0.1 mS/mm. The device A was improved in its characteristics because the source-drain electrode distance was small and the internal resistance was low.

EXAMPLE 2

A field effect transistor was manufactured using a non-diamond material as a gate insulating layer according to the manufacturing method shown in FIGS. 5A to 5D and FIGS. 6A to 6D. The diamond film was formed in the same manner as in Example 1. An $SiO_2$ film was formed on a p-layer 53 to a thickness of 0.2 μm by low pressure CVD. The ion implantation was also made under the same condition as in Example 1. The gate length of the field effect transistor was 1 μm and the source-drain electrode distance was 1.4 μm. The channel length was the same as the source-drain electrode distance which is 1.4 μm. The characteristics of this field effect transistor under the same bias condition as in Example 1 were as follow: both the drain current and the transconductance become twice as much as the value of the device A.

EXAMPLE 3

A field effect transistor having no gate insulating layer was manufactured. Using a (100) silicon substrate, an i-layer 52 was synthesized under the same condition as in Example 1. A p-layer 53 (concentration of doped boron: $10^{18}/cm^3$) was formed to a thickness of 0.3 μm. A WC gate electrode film 58 and side walls 582 made of $SiO_2$ were formed under the same condition as in Example 1. Each of the film thicknesses of WC and $SiO_2$ was 0.6 μm. The other process parameters are the same as in Example 1. In the field effect transistor that is manufactured, the gate length was 1 μm and the source-drain electrode distance was 1.4 μm. The drain current in this example was substantially the same as that in Example 2. However, the transconductance was increased to be 2 mS/mm.

EXAMPLE 4

A field effect transistor having the structure shown in FIG. 2 was manufactured according to the same processes as in Example 1. The ion implantation and the thermal treatment were made under the same conditions as in Example 1. The side walls 582 made of $SiO_2$ was etched using a 5% HF solution. A high resistance diamond film as a passivation film 591 was synthesized to a thickness of 1 μm. A mask of a $SiO_2$ film was then formed by photolithography, and contact holes were opened on the passivation film by ECR etching using an $O_2$ gas. Finally, as shown in FIG. 2, extraction electrodes 593 were formed. The initial characteristics of the manufacture field effect transistor were substantially the same as those shown in FIG. 7 (Example 1). When kept in the atmospheric air at 500° C. for 7 hrs., the field effect transistor in Example 1 showed an increase in the gate leak current by about one digit when a drain current of −20 V was applied. The field effect transistor in which the passivation film was formed, never changed in its characteristics.

EXAMPLE 5

A field effect transistor was manufactured using the same processes as in Example 1. The gate length was 0.8 μm and a source-drain electrode distance was 1.2 μm. The stepper was used to form a gate electrode pattern by lithography. The transconductance of this device was 5 mS/mm (for drain current of −20 V and the gate voltage of 2 V), and the mobility of the hole in the p-layer 53 was 1200 $cm^2/Vs$.

What is claimed is:

1. A diamond film field effect transistor comprising:
   a channel layer made of semiconducting diamond;
   an insulating layer made of high resistance diamond, which is formed on said channel layer;
   a gate electrode formed on said insulating layer over a channel region; and
   a source region and a drain region formed on the surface of said high resistance diamond in self-alignment to said gate electrode by ion implantation using said gate electrode as a mask.

2. A diamond film field effect transistor comprising:
   a channel layer made of semiconducting diamond;
   an insulating layer made of high resistance non-diamond material, which is formed on said channel layer;
   a gate electrode formed on said insulating layer over a channel region; and
   a source region and a drain region formed on the surface of said high resistance non-diamond material in self-alignment to said gate electrode by ion implantation using said gate electrode as a mask.

3. A diamond film field effect transistor, according to either of the claims 1 and 2, where said gate electrode comprises one of:
   a single layer film and a multi-layer film each made of at least one kind of material selected from a group consisting of:
   high melting point metals such as Au, Pt, W, Mo, Ta and Hf;
   carbon, Si, BN, and diamond, each of which is doped with impurities at a high concentration and has a low resistance; and
   carbides of W, Mo, Ta, Hf, Ti, V, Nb, Mn, Fe, Co, Ni, B and Si; and nitrides of Ti and Nb; and
   a layer made of a mixed material containing a plurality of the materials selected from said group.

4. A diamond film field effect transistor according to either of claims 1 and 2, where a source electrode and a drain electrode are formed to be respectively in contact with said source region and said drain region.

5. A diamond film field effect transistor according to claim 4, where each of said source electrode and said drain electrode comprises one of:
   a single layer film and a multi-layer film each made of at least one kind of material selected from a group consisting of:
   high melting point metals such as Au, Pt, W, Mo, Ta and Hf;
   carbon, Si, BN, and diamond, each of which is doped impurities at a high concentration and has a low resistance; and
   carbides of W, Mo, Ta, Hf, Ti, V, Nb, Mn, Fe, Co, Ni, B and Si; and nitrides of Ti and Nb; and
   a layer made of a mixed material containing a plurality of the materials selected from said group.

6. A diamond field effect transistor according to either of claims 1 and 2, wherein said source region and said drain region are formed by ion implantation using a mask comprising said gate electrode and side walls formed on side surfaces of said gate electrode.

7. A diamond film field effect transistor, according to claim 6, where said side wall comprises one of:
- a single layer film add a multi-layer film made of at least one kind of material selected from a group consisting of silicon oxide, silicon nitride, boron nitride and diamond; and
- a layer of a mixed material containing a plurality of the materials selected from said group.

8. A diamond field effect transistor according to either of claims 1 and 2, said source region and said drain region are formed by ion implantation using a mask comprising said gate electrode and a protective film formed on an upper surface of said gate electrode.

9. A diamond film field effect transistor, according to claim 8, where said protective film is removed after the formation of said source region and said drain region.

10. A diamond film field effect transistor, according to claim 1, where said gate insulating layer made of high resistance diamond has a film thickness ranging from 0.001 to 1 μm.

11. A diamond film field effect transistor, according to either of claims 1 and 2, where a passivation film having a resistivity of $10^{10}$ Ωcm or more is deposited over the whole surface of said transistor and contact holes for said gate electrode, a source electrode and a drain electrode are formed in said passivation film.

12. A diamond film field effect transistor, according to either of claims 1 and 2, where said channel layer and said insulating layer and said gate electrode are on a diamond film deposited on a material selected from a group consisting of artificial or natural monocrystalline diamond, and diamond formed by vapor-phase synthesis.

13. A diamond film field effect transistor, according to either of claims 1 and 2, where said semiconducting diamond is a high oriented diamond film formed by vapor-phase synthesis.

14. A diamond film field effect transistor, according to either of claims 1 and 2, where the gate length is 1 μm or less.

15. A diamond film field effect transistor, according to either of the claims 1 or 2, where said insulating layer under the gate electrode has a thickeness of 0.4 μm or less.

* * * * *